(12) United States Patent
Feygin et al.

(10) Patent No.: US 7,808,327 B2
(45) Date of Patent: Oct. 5, 2010

(54) METHOD AND APPARATUS TO PROVIDE DIGITALLY CONTROLLED CRYSTAL OSCILLATORS

(75) Inventors: Gennady Feygin, Plano, TX (US); Khurram Muhammad, Dallas, TX (US); Chih-Ming Hung, McKinney, TX (US); Meng-Chang Lee, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 218 days.

(21) Appl. No.: 11/500,083

(22) Filed: Aug. 7, 2006

(65) Prior Publication Data

US 2008/0042755 A1   Feb. 21, 2008

(51) Int. Cl.
 *H03B 27/00* (2006.01)
(52) U.S. Cl. .............................. 331/46; 331/47; 331/48; 331/55; 331/57
(58) Field of Classification Search .................. 331/46, 331/47, 49, 74
See application file for complete search history.

(56) References Cited

U.S. PATENT DOCUMENTS

| | | | | |
|---|---|---|---|---|
| 4,866,402 A | * | 9/1989 | Black | 331/1 A |
| 5,196,810 A | * | 3/1993 | Graether et al. | 331/49 |
| 6,150,858 A | * | 11/2000 | Sung | 327/156 |
| 6,433,645 B1 | * | 8/2002 | Mann et al. | 331/18 |
| 6,664,860 B2 | * | 12/2003 | Fallisgaard et al. | 331/18 |
| 6,963,249 B2 | * | 11/2005 | Devries et al. | 331/47 |
| 7,065,668 B2 | * | 6/2006 | Kosuda et al. | 713/500 |

OTHER PUBLICATIONS

*Colpitts oscillator*, http://en.wikipedia.org/wiki/Colpitts_oscillator, downloaded on May 2, 2006, 4 pages.
*CommsDesign Turning to Digital Crystal in GMS Transreceivers*, James Kimery, Silicon Laboratories; Sep. 26, 2002, URL: http://www.commsdesign.com/showArticle.jthml?articleID=16505594, 5 pages.
U.S. Appl. No. 10/966,220 entitled Methods and Apparatus to Control Frequency Offsets in Digitally Controlled Crystal Oscillators, filed on Oct. 14, 2004.

* cited by examiner

*Primary Examiner*—Arnold Kinkead
(74) *Attorney, Agent, or Firm*—Ronald O. Neerings; Wade James Brady, III; Frederick J. Telecky, Jr.

(57) ABSTRACT

Methods and systems to provide digitally controlled crystal oscillators are disclosed. One example method includes determining a state of an oscillator system and selecting a first output of a digitally controlled crystal oscillator or a second output of a second oscillator based on the determination. In an example implementation, the second oscillator is a ring oscillator.

23 Claims, 4 Drawing Sheets

*FIG. 7*

| STATE | DESCRIPTION OF SYSTEM STATE | POSITION OF THE SWITCHES | | SOURCE OF CLOCK OUTPUT (MUX SELECTED) | NOTES |
|---|---|---|---|---|---|
| | | 210 | 602 | | |
| 0 | SYSTEM STARTUP | CLOSED | OPEN | ILRO (MUX = 0) | ILRO CLOCK COMES UP FIRST, PROVIDES CLOCK TO STATE MACHINE, SPEEDS UP STARTUP OF DCXO |
| 1 | INJECTION LOCKING | OPEN | CLOSED | ILRO (MUX = 0) | ILRO CONTINUES TO PROVIDE CLOCK, GRADUALLY CHANGES IT'S FREQUENCY TO THAT OF DCXO |
| 2 | NORMAL OPERATION | OPEN | CLOSED | DCXO (MUX = 1) | GLITCHLESS SWITCHING TO DCXO LOW-NOISE CLOCK |
| 3 | PREPARATION FOR DCXO FREQUENCY JUMP | OPEN | OPEN | ILRO (MUX = 0) | GLITCHLESS SWITCHING TO ILRO CLOCK |
| 4 | DCXO FREQUENCY JUMP | OPEN | OPEN | ILRO (MUX = 0) | |
| 5 | INJECTION LOCKING | OPEN | CLOSED | DCXO (MUX = 1) | GLITCHLESS SWITCHING TO DCXO LOW-NOISE CLOCK |

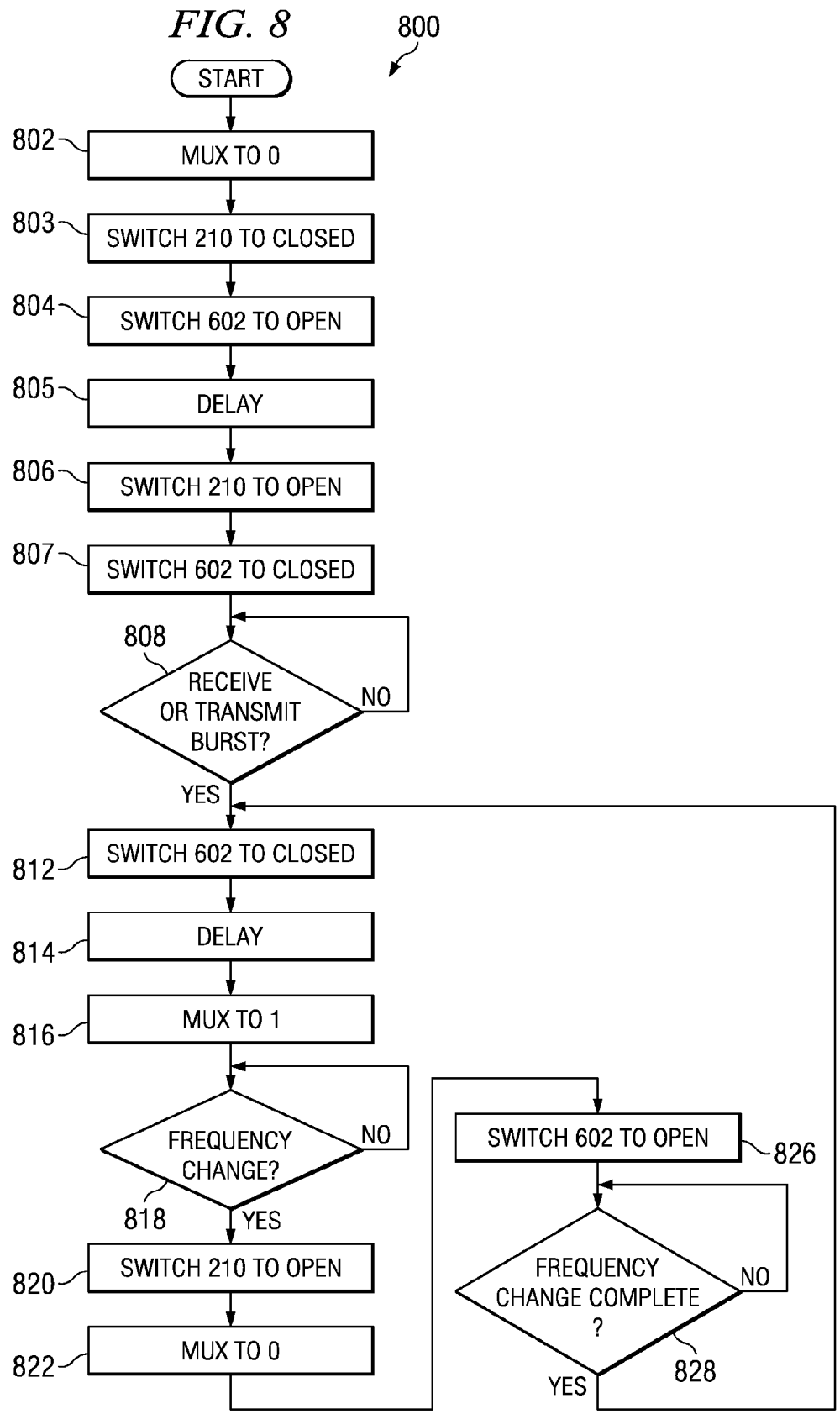

METHOD AND APPARATUS TO PROVIDE DIGITALLY CONTROLLED CRYSTAL OSCILLATORS

TECHNICAL FIELD

The present disclosure pertains to oscillators and, more particularly, to methods and apparatus to provide digitally controlled crystal oscillators.

BACKGROUND

As will be readily appreciated, crystal oscillators or crystals, which are found in many electrical circuits, are devices that are fabricated to resonate at predefined frequencies in response to applied voltages. For example, the ubiquitous color burst crystal resonates at a frequency of 3.57954 megahertz (MHz) and may be found in most televisions and radios.

Many systems and circuits utilize crystal oscillators to provide a clock reference representative of relative time. For example, microprocessors and microcontrollers typically utilize crystal oscillators to derive system clocks that control the rate at which data is read by input/output ports and/or the rate at which programming instructions are executed.

Communication systems and components such as telecommunications infrastructure and mobile units use crystal oscillators to generate one or more frequencies that are useful in producing radio frequency (RF) signals onto which information to be broadcast and received is imparted. For example, a crystal oscillator is usually used to generate a master reference clock that is used to synchronize information exchange between telecommunications infrastructure and mobile units.

Crystal oscillators all have tolerance ranges associated with their resonant frequency. The difference between the ideal resonant frequency of a crystal oscillator and the actual operating frequency of the crystal oscillator is referred to as the frequency offset of the crystal oscillator. For example, a crystal oscillator may be specified to have a tolerance between −10 parts-per-million (PPM) and +10 PPM at an operating temperature of 25° C. However, it is a rare situation in which a crystal oscillator is operated at the specified 25° C. temperature. Accordingly, in practice, the actual operational frequency of a crystal oscillator may vary outside the specified 25° C. tolerance. Therefore, there is almost always a frequency offset in a crystal oscillator.

Some applications, such as communications systems, require a high degree of crystal oscillator precision (i.e., very low frequency offset) to prevent interference with neighboring communication channels. To control more precisely the resonant frequency of a crystal oscillator, some communication systems utilize a digitally controlled crystal oscillator (DCXO) system in conjunction with a crystal. A DCXO system typically includes a processing portion that monitors the resonant frequency produced by a crystal oscillator and adjusts the resonant frequency of the crystal oscillator by changing the control code applied to the DCXO circuit. The change in applied code forces a change in the capacitive loading on the crystal oscillator thereby modifying the operating frequency of the crystal oscillator. The capacitive loading is typically achieved via one or more capacitors with switches. The Switches are controlled by the digital interfaces that accept the DCXO codes and connect or disconnect capacitors in response to the DCXO codes, as required.

DCXO systems can be easily tuned to a desired frequency and experience low levels of phase noise interference. However, DCXO systems require significant time to reach a desired frequency at startup and during frequency changes. In other words, immediately after startup, and/or during a frequency change, the signal output by the DCXO will not match the desired signal.

BRIEF DESCRIPTION OF THE DRAWINGS

FIG. 7 is state table describing example states for the control state machine of FIG. 1.

FIG. 8 is a flow diagram of an example process that may be carried out by the control state machine of FIG. 2 to implement the disclosed oscillator system.

DETAILED DESCRIPTION

Figure 1:
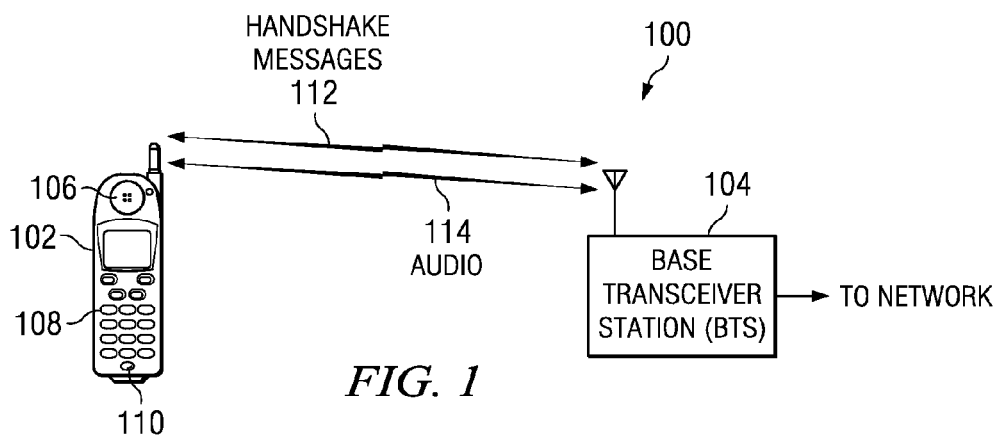
FIG. 1 is a diagram of an example communication system in which the disclosed oscillator system may be implemented.

As shown in FIG. 1, an example communication system 100 in which the digitally controlled crystal oscillator (DCXO) with injection-locked ring oscillator (DCORO) system and methods disclosed herein may be used includes a mobile unit 102 and infrastructure 104. The mobile unit 102 may be a cellular telephone, such as a global system for mobile communications (GSM) telephone, or any other type of telephone that may operate under the principles of frequency division multiple access (FDMA), time-division multiple access (TDMA), and/or code-division multiple access (CDMA). For example, the mobile unit 102 may operate using the advance mobile phone service (AMPS), IS-95, IS-136, or any other suitable protocol. Other applications of the communication system may include wireless network systems (e.g., Bluetooth wireless systems), global positioning systems (GPS), read channels for magnetic recording, satellite receivers, etc. As will be readily appreciated by those having ordinary skill in the art, the mobile unit 102 may include an earpiece speaker 106, a keypad 108, and a microphone 110 in addition to numerous other components such as communications circuits. As described below, the mobile unit 102 may also include a DCORO system.

The infrastructure 104 may be implemented using a base transceiver station (BTS) that is configured for wireless communications with the mobile unit 102. The infrastructure 104 may be coupled to one or more other infrastructure units, the plain old telephone system (POTS), or any other suitable network. As with the mobile unit 102, the infrastructure 104 may be implemented as a GSM base station, or as any other FDMA, TDMA, or CDMA compatible base station. In the example of FIG. 1, the communication protocols used by the mobile unit 102 and the infrastructure 104 are not important to this disclosure. Of course, the communication protocols used by the mobile unit 102 and the infrastructure 104 must be compatible for information exchange to be carried out between the mobile unit 102 and the infrastructure 104.

As described below, an Injection-Locked Ring Oscillator (ILRO) provided in the mobile unit 102 will, in general begin oscillating in a fraction of the time required for a DCXO in the mobile unit 102 to begin oscillating at sufficient amplitude to be useful as a clock reference synchronization signal. During this initial stage, when the ILRO clock is available while the DCXO clock is not yet available, the ILRO clock can be used as a principal clock source for a digital startup state machine.

The output of the free-running ILRO can also be used to inject energy into the DCXO crystal, thereby accelerating DCXO startup. After initial DCXO startup, clock pulses produced by the DCXO are applied to the ILRO. The ILRO frequency will gradually change until it is locked to the DCXO frequency. The mobile unit 102 now establishes communications with the infrastructure 104 through the use of handshake messages 112. The handshake messages 112 may include the mobile unit 102 informing the infrastructure 104 of its presence in the area serviced by the infrastructure 104, or any other suitable communications required to make the mobile unit 102 and the infrastructure 104 compatible and ready to exchange voice and data over RF channels.

As part of the handshake messages 112 provided by the infrastructure 104, the infrastructure 104 provides a frequency control message to the mobile unit 102. For example, if the mobile unit 102 and the infrastructure 104 operate using the GSM protocol, the infrastructure provides the mobile unit 102 with a pilot tone. The mobile unit 102 detects and demodulates the pilot tone and, thereby, obtains DCXO frequency offset information. The DCXO adjusts its DCXO code to tune the oscillator frequency accordingly. While the frequency of the DCXO is adjusted, the ILRO continues to generate the output of the DCORO system to compensate for perturbations such as, for example, missing and malformed clock pulses. The ILRO will gradually follow the frequency change inside the DCXO, while preventing missing or malformed clock pulses from propagating to the main clock output.

After the handshake messages 112 complete, and the mobile unit 102 and the infrastructure 104 achieve synchronization, the DCXO and the ILRO will be locked with identical frequency. At this point, the DCXO output replaces the ILRO output as the source of the reference clock. At this point, audio messages 114 may be exchanged. As will be readily appreciated by those having ordinary skill in the art, in digital communication systems, the audio messages are exchanged as sequences of encoded symbols representing bits and bytes of information that are used to reconstruct the analog audio to be exchanged. Additionally, although reference has been made to audio messages, those having ordinary skill in the art will readily recognize that data messages, video messages, and/or any other types of messages may be exchanged in the system 100 of FIG. 1.

Figure 2:
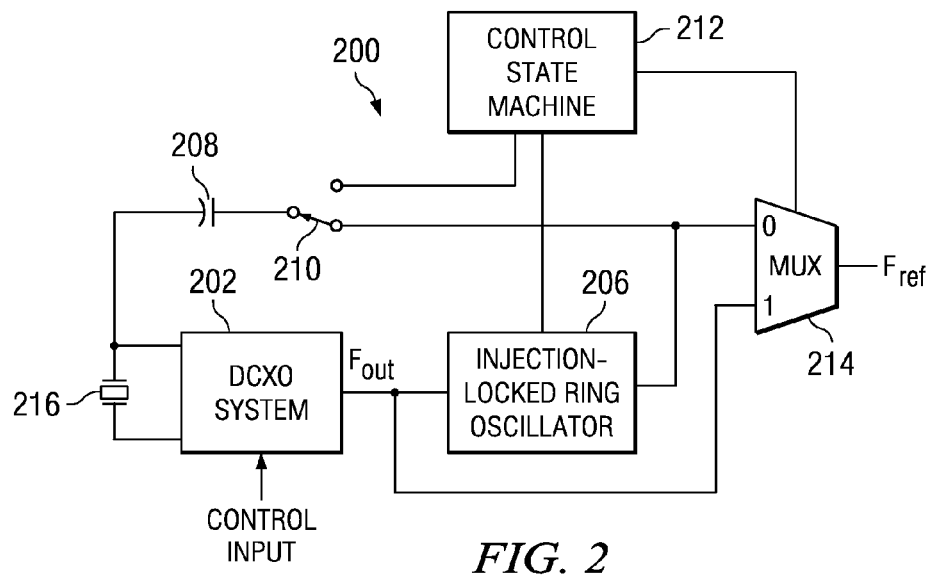
FIG. 2 is a block diagram of an example oscillator system.

Turning now to FIG. 2, a DCORO system 200, such as may be used in the mobile unit 102 or the infrastructure 104 of FIG. 1, is shown. At this point, it should be noted that while, for purposes of example and ease of understanding, the DCORO system 200 is described as being present within one or more of the components of the example communication system 100, the DCORO system 200 could be used in any number of different applications. For example, the DCORO system 200 could be used in any system in which low frequency offset at initial power up is desired. Such systems may include, control systems, other types of communications system, and virtually any circuit in which an oscillator is used.

As shown in FIG. 2, the DCORO system 200 includes DCXO system 202, an ILRO 206, a capacitor 208, a switch 210, a control state machine 212, and a multiplexer (MUX) 214. An oscillator 216 is coupled to the DCORO system 200.

In general, the DCORO system 200 provides an output signal having a desired frequency. In an example implementation described herein, the DCORO system 200 outputs a signal generated by the ILRO 206 when the system is initially started. During startup, the signal output by the ILRO 206 is also used as an injection source to initialize the oscillation of the DCXO system 202. When a low phase noise signal is desired, the control state machine 212 switches the MUX 214 to output the signal generated by the DCXO system 202. If a change in the frequency output by the DCXO system 202 is desired, the control state machine 212 switches the MUX 214 to output the signal generated by the ILRO 206. Then, the DCXO system 202 adjusts its output frequency to match the desired frequency. After the output of the DCXO system 202 has stabilized, the control state machine 212 switches the MUX 214 to output the signal generated by the DCXO system 202. Accordingly, the DCORO system 200 uses the ILRO 206 to eliminate discontinuities and variations that may occur during programming of the DCXO system 202.

Figure 3:
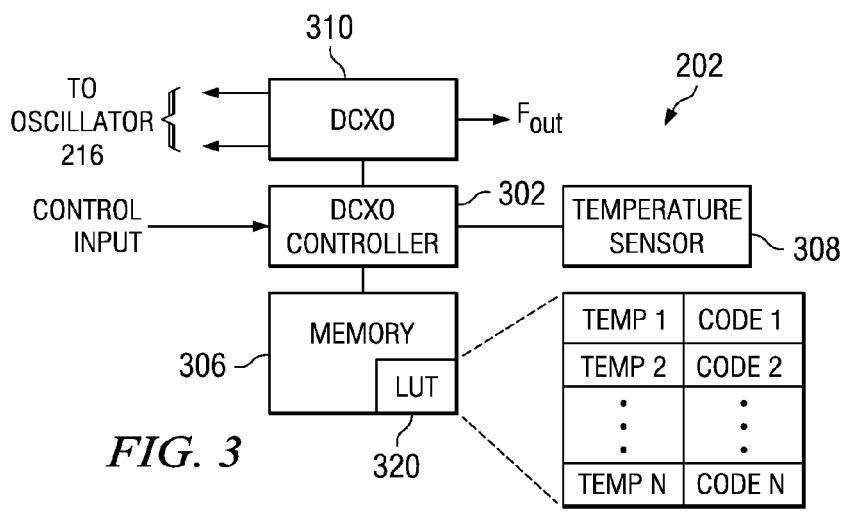
FIG. 3 is a block diagram of an example DCXO system.

The DCXO system 202 monitors the resonant frequency produced by the oscillator 216 and alters the resonant frequency to tune the frequency of the oscillator 216. One example DCXO system is described in US Patent Publication No. 20050093638 entitled "Methods and Apparatus to Control Frequency Offsets in Digitally Controlled Crystal Oscillators," which is incorporated herein by reference. An implementation similar to the DCXO system described US Patent Publication No. 20050093638 is illustrated in FIG. 3 and described in further detail herein. Of course, the implementations of the DCXO system 202 in FIG. 3 and the US Patent Publication No. 20050093638 are examples and any low-noise controlled oscillator system may be used.

The example DCXO system 202 may be implemented by any combination of hardware, firmware, software, and/or logic. For example, the DCXO system 202 may be implemented in hardware as an application specific integrated circuit (ASIC), either as a stand-alone device or as a portion of a larger device including a significant number of systems and circuits. Alternatively, the DCXO system 202 may be implemented as software or firmware code executed by a microcontroller or a microprocessor. For example, the DCXO system 202 may be a generic microprocessor or microcontroller, and software and/or firmware may be stored in a memory and loaded by the microcontroller or microprocessor at power up or some other time to implement the functionality of the DCXO system 202. Of course, in such an arrangement, the microcontroller or microprocessor may be used to implement other functions or perform other activities in addition to those performed by the DCXO system 202. Further, the DCXO system 202 may be replaced by any other type of oscillator.

Figure 6:
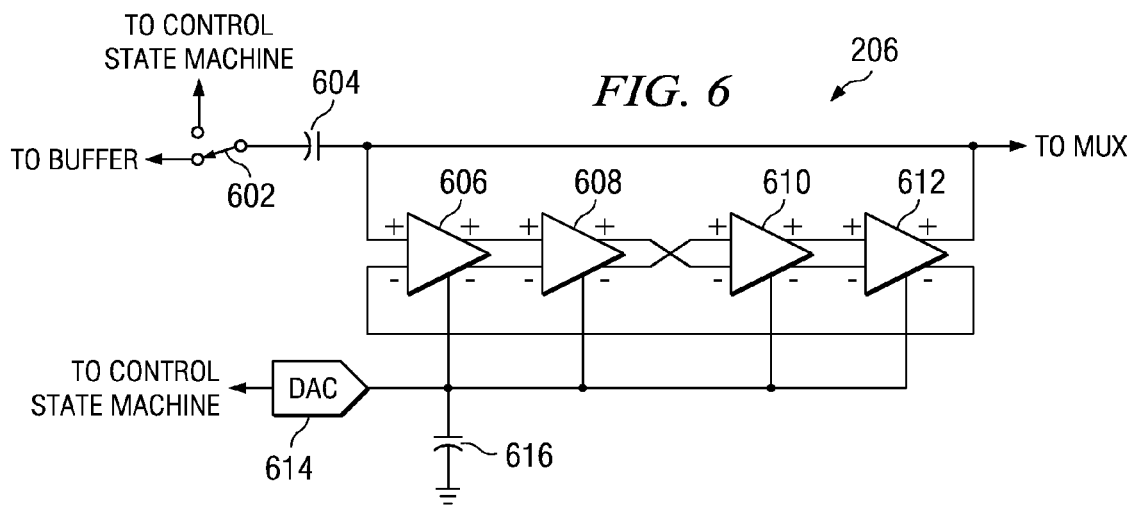
FIG. 6 is a schematic diagram of an example ring oscillator circuit.

The example ILRO 206 is an oscillation circuit that oscillates between a high voltage level and a low voltage level. In the example DCORO system 200, the output of the ILRO 206 is used as the output of the DCORO system 200 when the DCORO system 200 is initialized and when the frequency of the DCXO circuit 202 is changing (e.g., when the DCXO is being programmed or is responding to programming). In addition, the ILRO 206 is coupled to the DCXO system 202 to operate as an injection source to initialize the oscillation of the DCXO system 202. The example ILRO 206 is capable of operating at the frequencies similar to the operating frequencies of the DCXO circuit 202. An example implementation of the ILRO 206 is illustrated in FIG. 6 and described in further detail herein. Of course, the implementation of the ILRO 206 in FIG. 6 is an example and any oscillation circuit may be used such as, for example phase-locked oscillators, frequency-locked oscillators, etc.

The capacitor 208 acts as a filter to prevent low frequency or direct current (DC) from flowing from the ILRO 206 to the DCXO system 202 and the oscillator 216. The capacitor 208 allows only the clock edges of the oscillating signal output by the ILRO 206 to pass to the DCXO system 202 and the oscillator 216 and to reduce the strength of coupling between the two oscillators. Persons of ordinary skill in the art will recognize that the characteristics of the capacitor 208 will vary depending on the desired frequencies used in the DCORO system 200 and the desired amount of coupling between oscillators. In addition, the capacitor 208 may be replaced by one or more resistors or some combination of resistors and capacitors.

The switch 210 regulates whether the DCXO system 202 is injection locked to the ILRO 206. In other words, when the switch 210 is closed, the output signal of the ILRO 206 is used to influence the frequency of the DCXO system 202. When the switch 210 is opened, the DCXO system 202 is free-running. In the example DCORO system 200, the switch 210 is controlled by the control state machine 212. Alternatively, the switch 210 may be controlled by a microprocessor, a programmable logic area, a programmable logic controller, an application specific integrated circuit, or any other control system.

The control state machine 212 controls the ILRO 206, the state of the switch 210, and the state of the MUX 214. The example control state machine 212 is comprised of four states: 0) system startup (e.g., initialization), 1) normal operation (e.g., post-startup or post-initialization), 2) pre-frequency switch, and 3) post-frequency switch. The states or logic of the example control state machine 212 are illustrated in FIG. 7 and the example control state machine 212 is described in further detail herein. The example control state machine 212 may be implemented by any combination of hardware, firmware, software, and/or logic. For example, the control state machine 212 may be implemented in hardware as an application specific integrated circuit (ASIC), either as a stand-alone device or as a portion of a larger device including a significant number of systems and circuits. Alternatively, the control state machine 212 may be implemented as software or firmware code executed by a microcontroller or a microprocessor. For example, the control state machine 212 may be a generic microprocessor or microcontroller, and software and/or firmware may be stored in a memory and loaded by the microcontroller or microprocessor at power up or some other time to implement the functionality of the control state machine 212. Of course, in such an arrangement, the microcontroller or microprocessor may be used to implement other functions or perform other activities in addition to those performed by the control state machine 212.

The example MUX 214 receives two input signals and is controlled by the control state machine 212 to selectively output one signal. For example, during DCORO system 200 startup, the control state machine 212 instructs the MUX 214 to output signal 0 (the output of the ILRO 206). During normal operation of the DCORO system 200, the control state machine 212 instructs the MUX 214 to output signal 1 (the output of the DCXO system 202). The example MUX 214 may be implemented by any combination of hardware, firmware, software, and/or logic. For example, MUX 214 may be implemented in hardware as an application specific integrated circuit (ASIC), either as a stand-alone device or as a portion of a larger device including a significant number of systems and circuits. Alternatively, the MUX 214 may be implemented as software or firmware code executed by a microcontroller or a microprocessor. For example, the MUX 214 may be a generic microprocessor or microcontroller, and software and/or firmware may be stored in a memory and loaded by the microcontroller or microprocessor at power up or some other time to implement the functionality of the MUX 214. Of course, in such an arrangement, the microcontroller or microprocessor may be used to implement other functions or perform other activities in addition to those performed by the MUX 214.

The oscillator 216 may be implemented using any suitable oscillator. For example, the oscillator 216 may be a crystal oscillator, a ceramic resonator, or any other type of device that resonates at a particular frequency when a voltage is applied thereto. The oscillator 216 should be capable of being loaded to change its resonant frequency so that the DCXO system 202 can vary a reactive load in the resonant circuit to affect the operating frequency of the oscillator 216. The oscillator 216 may have a resonant frequency in any suitable range, such as, for example, 1 MHz to 300 MHz.

Turning now to FIG. 3, a DCXO system 202, such as may be used in the DCORO system 200 of FIG. 2, is shown. As shown in FIG. 3, the DCXO system 202 includes a DCXO controller 302 to which a transceiver 204, a memory 306, and a temperature sensor 308 are coupled. An oscillator 312 is coupled to the DCXO circuit 310. The oscillator 312 and the DCXO circuit 310 cooperate to produce an output frequency (Fout). The DCXO controller 302 adjusts the operation of the DCXO circuit 310 to control the output frequency (Fout) in accordance with data stored in the memory 306 and a temperature as measured by the temperature sensor 308. Subsequent to startup, the DCXO controller 302 controls the DCXO circuit 310 to operate in accordance with fine tuning data received from a control input and/or temperature data provided by the temperature sensor 308. The DCXO controller 302 stores the new fine tuning data in the memory 306 in association with the current temperature for use in subsequent startup operations. In this manner, the values stored in the memory 306 are adjusted over time to reflect changes in the DCXO circuit 310 and/or the oscillator 312, thereby ensuring the frequency offset remains at a desired level at startup prior to fine tuning.

In more detail, the DCXO controller 302 may be implemented by any combination of hardware, firmware, software, and/or logic. For example, the DCXO controller 302 may be implemented in hardware as an application specific integrated circuit (ASIC), either as a stand-alone device or as a portion of a larger device including a significant number of systems and circuits. Alternatively, the DCXO controller 302 may be implemented as software or firmware code executed by a microcontroller or a microprocessor. For example, the DCXO controller 302 may be a generic microprocessor or microcontroller, and software and/or firmware may be stored in the memory 306 and loaded by the microcontroller or microprocessor at power up or some other time to implement the functionality of the DCXO controller 302. Of course, in such an arrangement, the microcontroller or microprocessor may be used to implement other functions or perform other activities in addition to those performed by the DCXO controller 302.

The DCXO controller 302 receives an external control input. In the illustrated example, the external control input is information received from a transceiver associated with the mobile unit 102. For example, the transceiver, which may include a receiver portion that receives RF signals from an antenna receive and process RF signals provided by infrastructure (e.g., the infrastructure 104 of FIG. 1). In the DCXO system 202 of FIG. 3, the transceiver passes frequency control messages to the DCXO controller 302 to enable the DCXO controller 302 to fine tune the resonant frequency of the oscillator 312 via the DCXO circuit 310. The transceiver may also include a transmitter portion for sending information. Of course, the external control input may be any type of input suitable for the DCXO controller 302. For example, the external control input may be a feedback input, an input from another controller, an input from a user interface component, an input from audio circuitry, etc.

The memory 306 may be implemented using any suitable memory device or technology. For example, the memory 306 may be implemented using non-volatile memory such as flash memory. Alternatively, the memory 306 may be composed of any number of different memory technologies. The memory 306 may be an individual device or may be integrated with the DCXO controller 302. Further, the memory 306 may be exclusively dedicated to DCXO functionality or may be shared with other systems and circuits.

As shown in FIG. 3, the memory 306 stores a lookup table 320 including a number of temperature entries and corresponding DXCO codes. Depending on the size of the memory 306 (e.g., storage capacity) and system constraints, the lookup table 320 may include few entries or many entries.

The temperature sensor 308 may be implemented by any suitable temperature sensing device configured to sense the temperature of the oscillator 312, or at least the ambient temperature thereof. For example, the temperature sensor 308 could be implemented using a positive temperature coefficient (PTC) or negative temperature coefficient (NTC) thermistor, an infrared sensor, or any other suitable device. The temperature sensor 308 may be located proximate the oscillator 312 so that the temperature of the oscillator 312 may be provided to the DCXO controller 302.

As will be readily appreciated, the indication of the temperature to the DCXO controller 302 may be provided in an analog or a digital format. For example, the temperature sensor 308 may output an analog voltage corresponding to the sensed temperature. Alternatively, the temperature sensor 308 may include circuitry that produces digital bits or bytes representative of the sensed temperature. In either case, the DCXO controller 302 receives the temperature indication and processes the same. For example, the DCXO controller 302 may include an on-board analog-to-digital converter that samples analog temperature signals from the temperature sensor 308, or may include a bus or register for receiving a digital temperature indication.

The oscillator 312 may be implemented using any suitable oscillator. For example, the oscillator 312 may be a crystal oscillator, a ceramic resonator, or any other type of device that resonates at a particular frequency when a voltage is applied thereto. The oscillator 312 should be capable of being loaded to change its resonant frequency so that the DCXO circuit 310 can vary a reactive load in the resonant circuit to affect the operating frequency of the oscillator 312. The oscillator 312 may have a resonant frequency in any suitable range, such as, for example, 1 MHz to 300 MHz.

Figure 4:
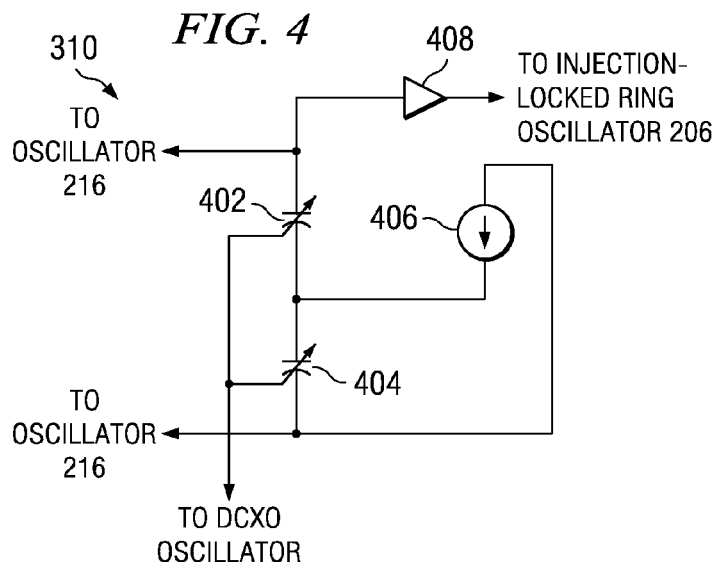
FIG. 4 is a schematic diagram of an example DCXO circuit.

An example implementation of the DCXO circuit 310 is shown in FIG. 4. The DCXO circuit 310 responds to the DCXO codes output from the DCXO controller 302 of FIG. 3 to alter the resonant frequency of the oscillator 216. The example DCXO circuit 310 includes a signal source 402, a first variable capacitor 404, and a second variable capacitor 406.

The first variable capacitor 404 and the second variable capacitor 406 are responsive to signals from the DCXO controller 302 to alter capacitance and thereby alter the resonant frequency of the oscillator 216. The first variable capacitor 404 and the second variable capacitor 406 may be implemented by a semiconductor capacitor array including individual capacitors that may be digitally controlled (e.g., digitally switched into and out of the resonant circuit) to change the total capacitance value used to load the oscillator 216. Alternatively, the first variable capacitor 404 and the second variable capacitor 406 may be implemented using semiconductor varactor diodes. In such an arrangement a digital-to-analog controller may be used to convert the digital tuning code to an analog voltage that is used to control the varactor diodes by variably reverse biasing the varactor diodes to affect a desired capacitance change.

The example DCXO circuit 310 also includes an output buffer 408 from which the output frequency (Fout) is taken. The output frequency may be connected to various other systems and circuits. The frequency of the signal from the output buffer 408 is substantially identical to the resonant frequency of the oscillator 216. However, the output buffer 408 prevents any other circuits from substantially affecting the resonant frequency of the oscillator 216 by providing isolation (e.g., a high impedance load) to the oscillator 216.

While the DCXO circuit 310 of FIG. 4 is shown as being a primarily capacitive circuit, it will be readily appreciated by those having ordinary skill in the art that other DCXO circuit implementations may include inductive components in addition to, or in place of, the capacitive component(s) of FIG. 4. Additionally, other topologies of DCXO circuits may be used. Thus, the DCXO circuit 310 may be implemented by any circuit including a variable or programmable reactive (i.e., capacitive and/or inductive) load coupled to the oscillator 216.

Figure 5:
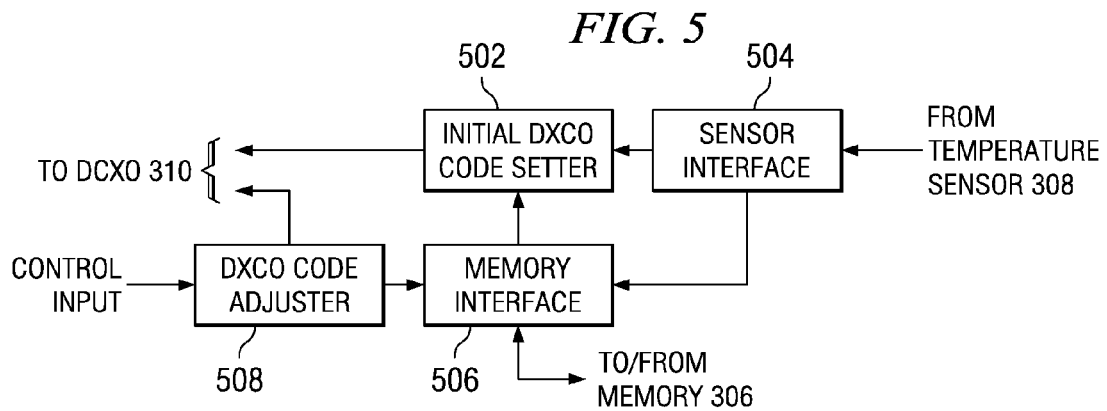
FIG. 5 is a block diagram of an example DCXO controller.

An example implementation of the DCXO controller 302 of FIG. 3 is shown in FIG. 5. The DCXO controller 302 may be implemented in hardware, software, or logic or any combination thereof. On initial power-up of the device in which the DCXO controller 302 is located, an initial DCXO code setter 502 reads the oscillator temperature via a sensor interface 504. After the temperature is read, the initial DCXO code setter 502 accesses the memory 306 through a memory interface 506 to retrieve a DCXO code corresponding to the temperature in memory 306 that is closest to the sensed temperature. The initial DCXO code setter 502 then outputs the retrieved DCXO code to the DCXO to implement the oscillator tuning.

After communication is established with another entity (e.g., with infrastructure 104), the DCXO controller 302 receives a frequency indication, such as an FCB. A DCXO code adjuster 508 then determines an adjusted DCXO code that is output to the DCXO to adjust the oscillator frequency. Subsequently, the DXCO code adjuster 508 provides the adjusted DCXO code to the memory interface 506 so that the adjusted DCXO code may be stored in memory 306. The memory interface 506 may also read the sensor interface 504 to determine the current oscillator temperature, which will be stored in association with the adjusted DCXO code.

An example implementation of the ILRO 206 of FIG. 2 is shown in FIG. 6. The example ILRO 206 oscillates between a high voltage level and a low voltage level with a desired frequency. The example ILRO 206 includes a switch 602, a first capacitor 604, a first differential inverter 606, a second differential inverter 608, a third differential inverter 610, a fourth differential inverter 612, a digital to analog converter (DAC) 614, and a second capacitor 616.

The switch 602 is controlled by the control state machine 212 of FIG. 2 to couple the DCXO system 202 to the ILRO 206 of FIG. 2. When the switch 210 is closed, the DCXO system 202 is coupled with the ILRO 206. The oscillating output of the ILRO 206 is injected into the DCXO system 202, causing the DCXO system 202 to modify its oscillation frequency until frequency locking is achieved. When the switch 210 is open, the DCXO system 202 is free-running and continues to oscillate at its natural frequency determined by the temperature, supply voltage and manufacturing process.

The first capacitor 604 acts as a filter to prevent low frequency or direct current (DC) from flowing from the DCXO system 202 to the first differential inverter 606. The first capacitor 604 allows the oscillating signal output by the DCXO system 202 to pass to the first differential inverter 606. Persons of ordinary skill in the art will recognize that the characteristics of the first capacitor 604 will vary depending on the desired frequencies used. In addition, the first capacitor 604 may be optional if it is not necessary to reduce energy coupling between oscillators.

The first differential inverter 606, the second differential inverter 608, the third differential inverter 610, and the fourth differential inverter 612 create an oscillating signal that is output to the MUX 214 of FIG. 2. In particular, when a positive signal is received by the first differential inverter 606 (i.e., the voltage drop between + input and the − input is positive), the first differential inverter 606 causes the output signal to have a positive voltage equal to the bias voltage of the first differential inverter 606. The second differential inverter 608 acts as a buffer and has the same effect on a signal as the first differential inverter 606. The connections between the second differential inverter 608 and the third differential inverter 610 are inverted. Thus, a positive voltage signal output by the second differential inverter 608 will be received as a negative voltage signal at the third differential inverter 610. Accordingly, the third differential inverter 610 will output a signal that is equal to the negative bias voltage. The fourth differential inverter 612 will act as a buffer and output the same signal as the third differential inverter 610. In summary, when a positive voltage signal is received by the first differential inverter 606, a negative voltage signal will be output by the fourth differential inverter 612. In contrast, when a negative voltage signal is received at the first differential inverter 606, a positive voltage signal will be output by the fourth differential inverter 612. Accordingly, the first differential inverter 606, the second differential inverter 608, the third differential inverter 610, and the fourth differential inverter 612 create an oscillating signal because they are connected in a feedback loop.

The DAC 614 converts a digital signal received from the control state machine 212 of FIG. 2 to an analog signal. The analog signal controls the current used to bias the first differential inverter 606, the second differential inverter 608, the third differential inverter 610, and the fourth differential inverter 612. By controlling the current, the control state machine 212 provides coarse control of the frequency at which the ILRO 206 oscillates. The DAC 614 may additionally include circuitry to determine the current ambient temperate and adjust the frequency (by controlling the current) of the ILRO 206 to compensate for changes in temperature. The example DAC 614 may be a current mode DAC, a voltage mode DAC, etc. The example DAC 614 may be implemented by any combination of hardware, firmware, software, and/or logic. For example, the DAC 614 may be implemented in hardware as an application specific integrated circuit (ASIC), either as a stand-alone device or as a portion of a larger device including a significant number of systems and circuits. Alternatively, the DAC 614 may be implemented as software or firmware code executed by a microcontroller or a microprocessor. For example, the DAC 614 may be a generic microprocessor or microcontroller, and software and/or firmware may be stored in a memory and loaded by the microcontroller or microprocessor at power up or some other time to implement the functionality of the DAC 614. Of course, in such an arrangement, the microcontroller or microprocessor may be used to implement other functions or perform other activities in addition to those performed by the DAC 614.

The second capacitor 616 acts as a filter to eliminate high frequency noise in the signal received from the DAC 614. In particular, the second capacitor 616 causes high frequency signals to be grounded. Persons of ordinary skill in the art will recognize that the characteristics of the second capacitor 616 will vary depending on the desired frequencies used. In addition, the second capacitor 616 may be optional if it is not necessary to block high-frequency noise.

While the example ILRO 206 illustrated in FIG. 6 is provided as an example, it should be understood that other implementations of a ring oscillator or any other oscillator may be used in the DCORO system 200. For example, the ring oscillator may use a delay lock loop (DLL) or phase lock loop (PLL) implementation. Differential inverters may also be replaced by single-ended inverters.

FIG. 7 is a state table describing examples states for the control state machine 212 of FIG. 2. The example state table includes six states (0, 1, 2, 3, 4, and 5). The first state (0) is associated with system startup of the DCORO system 200. In the first state, the control state machine 212 causes the MUX 214 to output the signal received at input port 0 of the MUX 214, switch 210 to be closed, and switch 602 to be open. The first state results in the oscillating signal from the ILRO 206 being output as Fref and the oscillating signal from the ILRO 206 being injected into the DCXO system 202 to drive the oscillation of the DCXO system 202. The injected oscillation of the ILRO 206 speeds up the startup of the DXCO system 202.

The second state (1) is associated with an injection locking of the ILRO 206 and the DCXO system 202. In the second state, the control state machine 212 causes the MUX 214 to output the signal received at the input port 0 of the MUX 214, switch 210 to be opened, and switch 602 to be closed (or remain closed). The second state results in the oscillating signal from the ILRO 206 to continue to be output as Fref. The DCXO system 202 and the ILRO 206 are coupled by switch 602 causing the frequency of the ILRO 206 to gradually adjust to the match the frequency of the DCXO system 202.

The third state (2) is associated with normal operation of the DCORO system 200. In the third state, the control state machine 212 causes the MUX 214 to output the signal received at the input port 1 of the MUX 214, switch 210 to be opened, and switch 602 to be closed (or remain closed). The third state results in the oscillating signal from the DCXO system 202 being output as Fref, the DCXO system 202 running free of the injection signal from the ILRO 206, and the oscillation of the oscillator 216 and the DCXO system 202 being injected into the ILRO 206 to influence the oscillation of the ILRO 206

The fourth state (3) is associated with preparing the DCORO system 200 for a frequency change. In the fourth state, the control state machine 212 causes the MUX 214 to output the signal received at input port 0 of the MUX 214, switch 210 to be opened, and switch 602 to be opened. The fourth state results in the oscillating signal from the ILRO 206 being output as Fref, the DCXO system 202 running free of the injection signal from the ILRO 206, and the ILRO 206 running free of the injection signal from the oscillator 216 and the DCXO system 202. In other words, the output signal from the ILRO 206, which is generating a signal with the same frequency as the signal generated by the DCXO system 202, is used as the output of the DCORO system 200.

The fifth state (4) is associated with a change in the DCXO system 202 output frequency. In the fifth state, the control state machine 212 causes the MUX 214 to output the signal received at input port 0 of the MUX 214, switch 210 to be opened, and switch 602 to be opened. While the oscillating signal from the ILRO 206 is used, the frequency of the DCXO system 202 is adjusted.

The sixth state (5) is associated with a return to normal operation following a frequency change of the DCXO system 202. In the sixth state, the control state machine 212 causes the MUX 214 to output the signal received at the input port 1 of the MUX 214, switch 210 to be opened, and switch 602 to be closed (or remain closed). The sixth state results in the oscillating signal from the DCXO system 202 being output as Fref, the DCXO system 202 running free of the injection signal from the ILRO 206, and the oscillation of the oscillator 216 and the DCXO system 202 being injected into the ILRO 206 to influence the oscillation of the ILRO 206. This state is associated with the same output of the MUX 214 and states of the switch 210 and switch 602 as state 2, but, during this state, the DCXO is programmed to oscillate at a different frequency.

The state table of FIG. 7 is provided as an example. In other implementations, there may be other states and/or controls that are performed by the control state machine 212. For example, delay states may be added between individual states. In addition, multiple controls of a state may be separated into multiple separate states. For example, control signals to the MUX 214 may be sent in separate state than control signals sent to the switch 210 and the switch 602. Delay states may be added between the states associated with the MUX 214 and states associated with the switch 210 and the switch 602.

FIG. 8 is a flow diagram of an example process 800 that may be carried out by the DCORO system 200 of FIG. 2. In an example implementation, firmware or software instructions stored in a memory may be retrieved and executed by a processor or controller that performs the process 800 to implement to the DCORO system 200. For example, the instructions may implement the control state machine 212. Alternatively, the process 800 may be implemented by dedicated hardware blocks that form the DCORO system 200, or could be implemented using a combination of hardware, software, and/or firmware.

The illustrated process 800 begins operation by setting the MUX 214 to output the signal connected to port 0 of the MUX 214 (the signal output by the ILRO 206) (block 802). Then, the control state machine 212 causes switch 210 to be closed (block 803). Next, the control state machine 212 causes switch 602 to be opened (block 804). Blocks 802-804 implement the first state (0) of the example state table illustrated in FIG. 7.

Then, the DCORO system 200 delays before moving to the second state (1) (block 805). The amount of the delay depends on the amount of time required for the DCXO 202 to startup.

Next, the control state machine 212 causes switch 210 to be opened (block 806). The control state machine 212 causes witch 602 to be closed (block 807). Blocks 806-807 implement the second state (1) of the example state table illustrated in FIG. 7.

Then, the DCORO system 200 determines if a low phase noise signal is desired (e.g., shortly before a burst of data transmission or reception) (block 808). If a low phase noise signal is not desired, the system waits until a low phase noise signal is desired. If a low phase noise signal is desired, the control state machine 212 causes switch 602 to be closed (block 812). The control state machine 212 then delays a predetermined amount of time (block 814). The length of the delay may be selected to allow the DCXO system 202 to stabilize. After the delay, the MUX 214 is set to output the signal connected to port 1 (the signal output by the DCXO system 202) (block 816). Blocks 810-816 implement the third state (2) and the fourth state (3) of the example state table illustrated in FIG. 7

Then, the DCORO system 200 determines if a frequency change is requested and/or is about to occur (block 818). If a frequency change has not been requested and is not about to occur, the system waits until a frequency change is requested or is about to occur. If a frequency change is requested and/or is about to occur, the control state machine 212 causes switch 210 to be opened (block 820). The MUX 214 is then set to output the signal connected to port 0 (block 826). Then, the control state machine 212 causes switch 602 to be closed (block 822).

Then, the DCORO system 200 determines if the frequency change is complete (block 818). If the frequency change is not yet complete, the system waits until the frequency change is complete. If the frequency change is complete, the control proceeds to block 810 to return the DCORO system 200 to normal operation (the sixth state (5) of the example state table illustrated in FIG. 7). Blocks 820-826 implement the fourth state (3) and the fifth state (4) of the example state table illustrated in FIG. 7.

Although certain methods and apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents. Further, although an example process is described with reference to the flowchart illustrated in FIG. 8 persons of ordinary skill in the art will readily appreciate that many other methods of implementing the DCORO system 200 may alternatively be used. For example, the DCORO system 200 may cause the ILRO 206 to be powered off when not in use (e.g., when the output of the DCXO 202 is used). The DCORO system 200 may cause the ILRO 206 to be powered shortly before the time that it is to be used. In addition, the order of execution of the blocks may be changed, and/or some of the blocks described may be changed, eliminated, or combined.

What is claimed is:

1. A system comprising:
    a digitally controlled crystal oscillator;
    a second oscillator, wherein the digitally controlled crystal oscillator is injection-locked to the second oscillator; and
    a controller to selectively couple an output terminal to one of a first output of the digitally controlled crystal oscillator or a second output of the second oscillator, wherein a first switch couples an output of the second oscillator to the digitally controlled crystal oscillator, and a second switch couples an output of the digitally controlled crystal oscillator to the second oscillator.

2. A system as defined in claim 1, wherein the second oscillator is locked to the digitally controlled crystal oscillator.

3. A system as defined in claim 1, wherein the controller is a state machine.

4. A system as defined in claim 1, further comprising a multiplexer that receives the first output and the second output.

5. A system as defined in claim 4, wherein selecting between a first output associated with the digitally controlled crystal oscillator and a second output associated with the second oscillator comprises instructing the multiplexer to select one of the first output or the second output.

6. A system as defined in claim 1, wherein the digitally controlled crystal oscillator comprises:
an oscillator;
an adjustable reactive load coupled to the oscillator; and
a signal source.

7. A system as defined in claim 6, wherein the digitally controlled crystal oscillator further comprises a digitally controlled crystal oscillator controller to control the adjustable reactive load.

8. A system as defined in claim 1, wherein the second oscillator is at least one of a ring oscillator a phase-locked oscillator, or a frequency-locked oscillator.

9. A system as defined in claim 1, wherein the output of the second oscillator is injected into the digitally controlled crystal oscillator.

10. A method comprising:
determining a state of an oscillator system;
selecting a first output of a first oscillator or a second output of a digitally controlled crystal oscillator based on the determination; the digitally controlled crystal oscillator is injection locked to the first oscillator;
opening or closing a first switch based on the determination; and
opening or closing a second switch different than the first switch based on the determination.

11. A method comprising:
determining a state of an oscillator system;
selecting a first output of a first oscillator or a second output of a digitally controlled crystal oscillator based on the determination; the digitally controlled crystal oscillator is injection locked to the first oscillator;
opening or closing a first switch based on the determination; and
opening or closing a second switch different than the first switch based on the determination, wherein the second switch couples the second output to the first oscillator.

12. A non-transitory machine-accessible medium having a plurality of machine accessible instructions that, when executed, cause a machine to:
determine a state of an oscillator system;
select a first output of a first oscillator or a second output of a digitally controlled crystal oscillator based on the determination; the digitally controlled crystal oscillator is injection locked to the first oscillator;
cause the machine to open or close a first switch based on the determination; and
open or close a second switch different than the first switch based on the determination.

13. A system comprising:
a digitally controlled crystal oscillator;
a second oscillator, wherein the digitally controlled crystal oscillator is injection-locked to the second oscillator;
a controller to select between a first output associated with the digitally controlled crystal oscillator and a second output associated with the second oscillator; and
a multiplexer that receives the first output and the second output, wherein a first switch couples an output of the second oscillator to the digitally controlled crystal oscillator, and a second switch couples an output of the digitally controlled crystal oscillator to the second oscillator.

14. A system as defined in claim 13, wherein selecting between a first output associated with the digitally controlled crystal oscillator and a second output associated with the second oscillator comprises instructing the multiplexer to select one of the first output or the second output.

15. A method comprising:
determining a state of an oscillator system;
selecting a first output of a first oscillator or a second output of a digitally controlled crystal oscillator injection-locked to the first oscillator based on the determination by causing a multiplexer to output the first output if the oscillator system is in a first state or to output the second output if the oscillator system is in a second state, wherein a first switch couples an output of the first oscillator to the digitally controlled crystal oscillator, and a second switch couples an output of the digitally controlled crystal oscillator to the first oscillator.

16. A method as defined in claim 15, wherein the first state is associated with initialization of the oscillator system.

17. A method as defined in claim 15, wherein the second state is associated with a post-initialization state.

18. A method as defined in claim 15, wherein the first state is associated with a frequency change of the digitally controlled crystal oscillator.

19. A non-transitory machine-accessible medium having a plurality of machine accessible instructions that, when executed, cause a machine to:
determine a state of an oscillator system;
select a first output of a first oscillator or a second output of a digitally controlled crystal oscillator injection-locked to the first oscillator based on the determination by causing a multiplexer to output the first output if the oscillator system is in a first state or output the second output if the oscillator system is in a second state, wherein a first switch couples an output of the first oscillator to the digitally controlled crystal oscillator, and a second switch couples an output of the digitally controlled crystal oscillator to the first oscillator.

20. A non-transitory machine-accessible medium as defined by claim 19, wherein the first state is associated with initialization of the oscillator system.

21. A non-transitory machine-accessible medium as defined by claim 19, wherein the second state is associated with a post-initialization state.

22. A method comprising:
determining a state of an oscillator system;
selecting a first output of a first oscillator or a second output of a digitally controlled crystal oscillator based on the determination;
opening or closing a first switch based on the determination, wherein the first switch causes the digitally controlled crystal oscillator to be injection-locked to the first oscillator opening and closing a second switch based on the determination, wherein the second switch couples an output of the digitally controlled crystal oscillator to the first oscillator.

23. A non-transitory machine-accessible medium having a plurality of machine accessible instructions that, when executed, cause a machine to:
determine a state of an oscillator system;
select a first output of a first oscillator or a second output of a digitally controlled crystal oscillator based on the determination;
cause the machine to open or close a first switch based on the determination, wherein the first switch causes the digitally controlled crystal oscillator to be injection-locked to the first oscillator and further cause the machine to open or close a second switch based on the determination, wherein the second switch couples the output of the digitally controlled crystal oscillator to the first oscillator.

* * * * *